(12) United States Patent
Tanaka et al.

(10) Patent No.: US 9,331,103 B1
(45) Date of Patent: May 3, 2016

(54) LIQUID CRYSTAL DISPLAY AND MANUFACTURING METHOD THEREOF

(71) Applicant: Samsung Display Co., Ltd., Yongin (KR)

(72) Inventors: Sakae Tanaka, Suwon-si (KR); Hiroshi Yoshimoto, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/692,893

(22) Filed: Apr. 22, 2015

(30) Foreign Application Priority Data

Oct. 13, 2014 (KR) .......................... 10-2014-0137545

(51) Int. Cl.
    *H01L 27/12* (2006.01)
    *H01L 21/02* (2006.01)
    *H01L 29/66* (2006.01)
    *H01L 29/786* (2006.01)

(52) U.S. Cl.
    CPC .......... *H01L 27/124* (2013.01); *H01L 21/0217* (2013.01); *H01L 21/02271* (2013.01); *H01L 21/02565* (2013.01); *H01L 27/1225* (2013.01); *H01L 27/1259* (2013.01); *H01L 29/66969* (2013.01); *H01L 29/7869* (2013.01); *H01L 29/78606* (2013.01); *H01L 29/78648* (2013.01)

(58) Field of Classification Search
    None
    See application file for complete search history.

(56) References Cited

U.S. PATENT DOCUMENTS

| | | | |
|---|---|---|---|
| 6,400,436 B1 | 6/2002 | Komatsu | |
| 7,956,947 B2 | 6/2011 | Lee et al. | |
| 8,450,741 B2 | 5/2013 | Murakami et al. | |
| 8,466,463 B2 | 6/2013 | Akimoto et al. | |
| 8,487,309 B2 | 7/2013 | Oda et al. | |
| 8,835,919 B2 * | 9/2014 | Yu ..................... | H01L 29/66742 257/43 |
| 2013/0250399 A1 | 9/2013 | Tanaka | |
| 2014/0008645 A1 * | 1/2014 | Yu ..................... | H01L 29/66742 257/43 |
| 2015/0221674 A1 * | 8/2015 | Cheng ................ | H01L 27/1225 257/43 |

FOREIGN PATENT DOCUMENTS

| | | |
|---|---|---|
| JP | 4809544 | 8/2011 |
| JP | 2012178439 | 9/2012 |

(Continued)

OTHER PUBLICATIONS

Haruka Yamazaki, et al., "The Influence of fluorinated SiNx Gate Insulator in a-InGaZnO Thin Film Transistors", AM-FPD, p. 43-46, 2013.

(Continued)

*Primary Examiner* — Joseph Schoenholtz
(74) *Attorney, Agent, or Firm* — Cantor Colburn LLP

(57) ABSTRACT

A liquid crystal display includes a substrate, a gate line disposed on the substrate and including a bottom gate electrode, a first insulating layer covering the gate line, an active member including a channel which is disposed on the first insulating layer and overlaps the bottom gate electrode and a source electrode and a drain electrode at both end sides of the channel, a pixel electrode on the same layer as the active member, a second insulating layer covering the active member and the pixel electrode, a data line on the second insulating layer and connected to the active member, a passivation layer covering the data line, where the active member and the pixel electrode include an oxide semiconductor and the first insulating layer is a silicon nitride layer which includes a fluorine atom in the range of about 10 atm % to about 35 atm %.

18 Claims, 15 Drawing Sheets

(56) References Cited

FOREIGN PATENT DOCUMENTS

| | | |
|---|---|---|
| JP | 2013084725 | 5/2013 |
| KR | 1020130036681 | 4/2013 |
| KR | 1020130051701 | 5/2013 |

OTHER PUBLICATIONS

Mitsuru Nakata, et al., "Novel Fabrication Method for Self-Aligned Bottom-Gate Oxide TFTs", IDW AMD 4-4L(Nakata Mitsuru NHK Science & Technology Research Lab.), p. 431-432, 2012.

* cited by examiner

LIQUID CRYSTAL DISPLAY AND MANUFACTURING METHOD THEREOF

This application claims priority to Korean Patent Application No. 10-2014-0137545 filed on Oct. 13, 2014, and all the benefits accruing therefrom under 35 U.S.C. §119, the entire contents of which are incorporated herein by reference.

BACKGROUND (a) Field

The invention relates to a liquid crystal display and a manufacturing method thereof.

(b) Description of the Related Art

A liquid crystal display ("LCD") is one of the flat panel displays which have been most widely used. In the LCD, a voltage is applied to an electrode to rearrange liquid crystal molecules of a liquid crystal layer so as to control an amount of transmitted light.

The LCD may be made to be slimmer but has side visibility lower than front visibility. To overcome the above problem, various types of liquid crystal arrays and driving methods have been developed. As a method for implementing a wide viewing angle, an LCD in which a pixel electrode and a common electrode are disposed on a single substrate has drawn much attention.

In the LCD, an oxide thin film transistor ("TFT") has been manufactured using a self-aligned bottom gate. The self-aligned bottom gate is as follows. First, a gate electrode is disposed on a glass substrate, a gate insulating layer including a silicon oxide layer ($SiO_2$) is provided to cover the gate electrode, an oxide semiconductor is disposed on a gate insulating layer, and then an excimer laser, for example, an excimer laser using Xenon-chloride (Xecl) having a wavelength of about 308 nanometers (nm), and the like is irradiated from a bottom portion of the glass substrate. In this case, a laser beam is irradiated to the oxide semiconductor using the gate electrode as a light blocking mask, in which a region to which the laser beam is irradiated becomes a conductor.

SUMMARY

A gate insulating layer including a silicon oxide layer ($SiO_2$) may transmit the excimer laser beam without any problem. However, alkali metal ions of about 1 percent (%) or less included in an organic substrate for a liquid crystal display ("LCD") are electric field-diffused to the gate insulating layer including the silicon oxide layer ($SiO_2$).

Further, when the gate insulating layer is formed as a silicon nitride layer, the electric field diffusion of the alkali metal ions included in the organic substrate for the LCD may be prevented, but a silicon nitride layer (P-SiNx:H) deposited with three kinds of gases ($SiH_4+NH_3+N_2$) as a raw material transmits only the excimer laser beam of about 5% when a thin thickness thereof is about 200 nanometers (nm) and transmits only the excimer laser beam of about 7% even when the film thickness thereof is about 100 nm.

The invention has been made in an effort to provide an LCD including a thin film transistor ("TFT") having a simple structure and improved reliability and a manufacturing method thereof.

An exemplary embodiment of the invention provides a liquid crystal display, including a substrate, a gate line disposed on the substrate and including a bottom gate electrode, a first insulating layer covering the gate line, an active member including a channel which is disposed on the first insulating layer and overlaps the bottom gate electrode and a source electrode and a drain electrode which are positioned at both sides of the channel, a pixel electrode disposed on the same layer as the active member, a second insulating layer covering the active member and the pixel electrode, a data line disposed on the second insulating layer and connected to the active member, a passivation layer covering the data line, and a common electrode disposed on the passivation layer and overlapping the pixel electrode, where the active member and the pixel electrode include an oxide semiconductor.

In an exemplary embodiment, the first insulating layer may be a silicon nitride layer which includes a fluorine atom in the range of about 10 atm % to about 35 atm %.

In an exemplary embodiment, the LCD may further include a top gate electrode disposed on the second insulating layer and overlapping the bottom gate electrode.

In an exemplary embodiment, a width of the top gate electrode may be smaller than that of the bottom gate electrode.

In an exemplary embodiment, an edge of the top gate electrode may be positioned inside an edge of the corresponding bottom gate electrode.

In an exemplary embodiment, a first edge nearest to the pixel electrode among edges of the bottom gate electrode may be more adjacent to the pixel electrode than a second edge nearest to the pixel electrode among edges of the top gate electrode.

In an exemplary embodiment, the data line may be connected to the active member through a first contact hole which is defined in the first insulating layer and the top gate electrode may be connected to the bottom gate electrode through second contact holes which are defined both in the first insulating layer and the second insulating layer.

In an exemplary embodiment, the first insulating layer may be a silicon nitride layer which includes a fluorine atom in the range of about 10 atm % to about 35 atm %.

In an exemplary embodiment, a thickness of the first insulating layer may be about 50 nm to about 1000 nm and a thickness of the second insulating layer may be about 50 nm to about 1000 nm.

In an exemplary embodiment, an extending direction of the data line, an extending direction of the pixel electrode, and an extending direction of the common electrode may be disposed to be parallel with one another.

In an exemplary embodiment, the data line, the pixel electrode, and the common electrode may be bent within a pixel area in which the gate line and the data line intersect each other, while being insulated from each other.

In an exemplary embodiment, an angle between the bottom gate electrode and the data line may be about 70 degrees (°) to about 80°.

Another exemplary embodiment of the invention provides a manufacturing method of a liquid crystal display, including forming a gate line including a bottom gate electrode on a substrate, forming a first insulating layer as a silicon nitride layer covering the gate line and including a fluorine atom of about 10 atm % to about 35 atm %, forming an oxide semiconductor on the first insulating layer, forming an active member and a pixel electrode on the oxide semiconductor by irradiating an excimer laser using the bottom gate electrode as a light blocking mask, forming a second insulating layer covering the active member and the pixel electrode, forming a data line intersecting the gate line on the second insulating layer, forming a passivation layer covering the data line, and forming a common electrode overlapping the pixel electrode on the passivation layer.

In an exemplary embodiment, in the forming of the data line, the top gate electrode overlapping the bottom gate electrode may be formed.

In an exemplary embodiment, the second insulating layer may be a silicon nitride layer which includes a fluorine atom in the range of about 10 atm % to about 35 atm %.

In an exemplary embodiment, the first insulating layer and the second insulating layer may be formed by providing a reaction of mixed gas of silicon fluorine ($SiF_4$) and nitrogen ($N_2$) in a chemical vapor deposition ("CVD") apparatus.

According to an embodiment of the invention, it may prevent the electric field diffusion of the alkali metal ions included in the substrate including glass by forming the first insulating layer provided as the silicon nitride layer (SiNx) including the fluorine atom of about 10 atm % to about 35 atm % to cover the bottom gate electrode, thereby increasing the reliability of the TFT.

Further, it may selectively perform the high temperature annealing treatment on the region other than the region blocked by the bottom gate electrode in the process of making the oxide semiconductor conductive using the excimer laser since the first insulating layer provided as the silicon nitride layer (SiNx) including the fluorine atoms in the range of about 10 atm % to about 35 atm % transmits the excimer laser very well. Therefore, it may make the structure of the TFT simple since the high temperature annealing process is applied to or performed on the selected region of the oxide semiconductor to form the source electrode, the channel, the drain electrode, and the pixel electrode.

Further, it may improve the aperture ratio since the pixel electrode is connected to the drain electrode on the same layer of the same material as the drain electrode and thus there is no need to define the separate contact hole for connecting the pixel electrode to the drain electrode.

Further, it may prevent the off current from occurring since the common electrode overlaps the pixel electrode including the oxide semiconductor, and thus the channel of the active member which is defined on the same layer as the pixel electrode and includes the oxide semiconductor may be affected by the electric field of the common electrode but the double gate structure configured of the bottom gate electrode and the top gate electrode may block the electric field of the common electrode from being applied to the top gate electrode.

Further, it may suppress an occurrence of afterimage by making the width of the top gate electrode smaller than that of the bottom gate electrode and making the edge of the top gate electrode be positioned inside the edge of the corresponding bottom gate electrode to minimize the parasitic capacitance generated between the top gate electrode and the pixel electrode and minimize the kickback voltage at the time of turning off the TFT.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
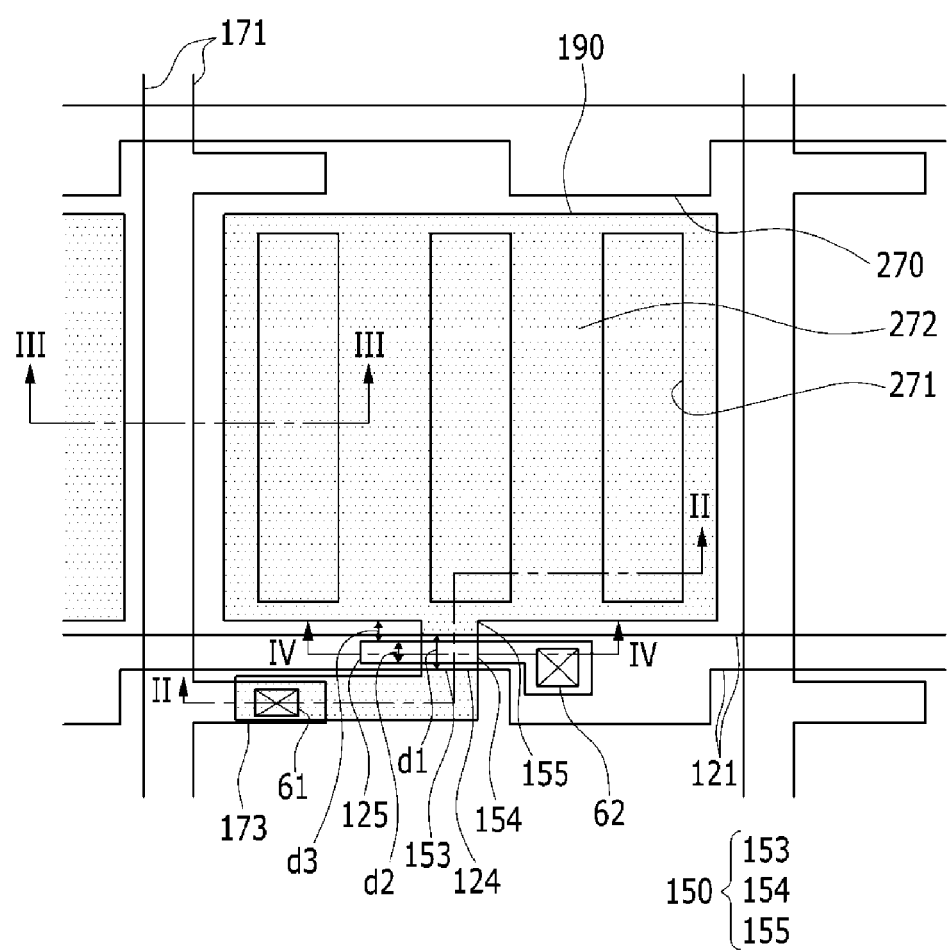
FIG. 1 is a plan view of a liquid crystal display ("LCD") according to an exemplary embodiment of the invention.

In the following detailed description, only certain exemplary embodiments of the invention have been shown and described, simply by way of illustration. As those skilled in the art would realize, the described embodiments may be modified in various different ways, all without departing from the spirit or scope of the invention.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a liquid crystal display ("LCD") according to an exemplary embodiment of the invention will be described in detail with reference to FIGS. 1 to 5.

Figure 2:
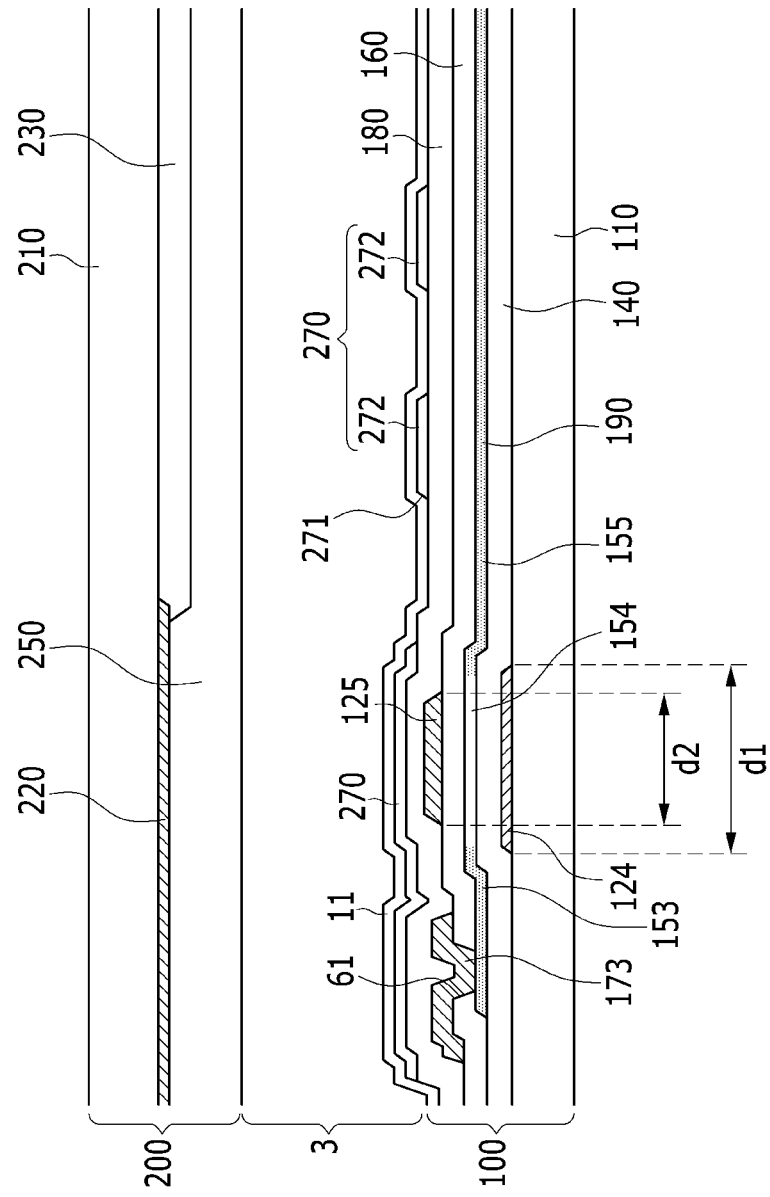
FIG. 2 is a cross-sectional view of the LCD of FIG. 1 taken along line II-II.
Figure 3:
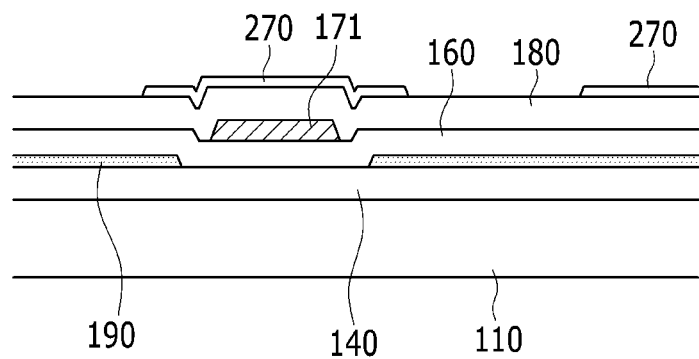
FIG. 3 is a cross-sectional view of the LCD of FIG. 1 taken along line III-III.
Figure 4:
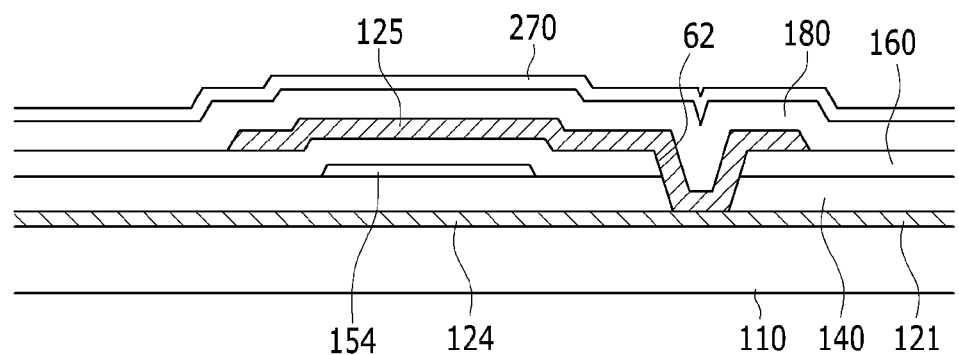
FIG. 4 is a cross-sectional view of the LCD of FIG. 1 taken along line IV-IV.

FIG. 1 is a plan view of an LCD according to an exemplary embodiment of the invention, FIG. 2 is a cross-sectional view of the LCD of FIG. 1 taken along line II-II, FIG. 3 is a cross-sectional view of the LCD of FIG. 1 taken along line III-III, and FIG. 4 is a cross-sectional view of the LCD of FIG. 1 taken along line IV-IV.

As illustrated in FIGS. 1 to 4, the LCD according to the exemplary embodiment of the invention includes a bottom display panel 100 and a top display panel 200 which face each other and a liquid crystal layer 3 injected therebetween.

First, the bottom display panel 100 will be described.

Gate lines 121 are positioned on a substrate 110 including transparent glass, plastic, or the like. The gate lines 121 transfer gate signals and mainly extend in a horizontal direction. Each gate line 121 includes a plurality of bottom gate electrodes 124 which protrudes downwardly in a plan view. In an exemplary embodiment, the gate line 121 may include a gate pad part (not illustrated) for connecting to another layer or an external driving circuit.

In an exemplary embodiment, the gate line 121 may include aluminum based metals such as aluminum (Al) and aluminum alloy, silver based metals such as silver (Ag) and silver alloy, copper based metals such as copper (Cu) and copper alloy, molybdenum based metals such as molybdenum (Mo) and molybdenum alloy, chromium (Cr), tantalum (Ta), titanium (Ti), and the like. However, the invention is not limited thereto, and the gate line 121 may have a multilayer structure including at least two conductive layers having different physical properties.

A first insulating layer 140 is disposed on the gate line 121. In an exemplary embodiment, the first insulating layer 140 may be a silicon nitride layer (P-SiNx:F) including a fluorine atom of about 10 atm % to about 35 atm %, for example. In an exemplary embodiment, a thickness of the first insulating layer 140 may be about 50 nanometers (nm) to about 1000 nm, preferably, about 70 nm to about 700 nm, for example.

In an exemplary embodiment, the first insulating layer 140 covering the bottom gate electrode 124 may be provided as the silicon nitride layer (P-SiNx:F) including the fluorine atom of about 10 atm % to about 35 atm %, for example, to prevent electric field diffusion of alkali metal ions included in the substrate 110 including glass and minimize a threshold voltage shift of an oxide semiconductor, thereby increasing reliability of a thin film transistor ("TFT").

Further, it may selectively perform high temperature annealing treatment on a region other than a region blocked by the bottom gate electrode 124 in a process of making the oxide semiconductor conductive using excimer laser since the first insulating layer 140 provided as the silicon nitride layer (P-SiNx:F) including the fluorine atoms of about 10 atm % to about 35 atm %, for example, transmits the excimer laser very well. Therefore, it may make a structure of a TFT simple since the high temperature annealing process is performed on the selected region of the oxide semiconductor to form a source electrode, a channel, a drain electrode, and a pixel electrode.

Figure 5:
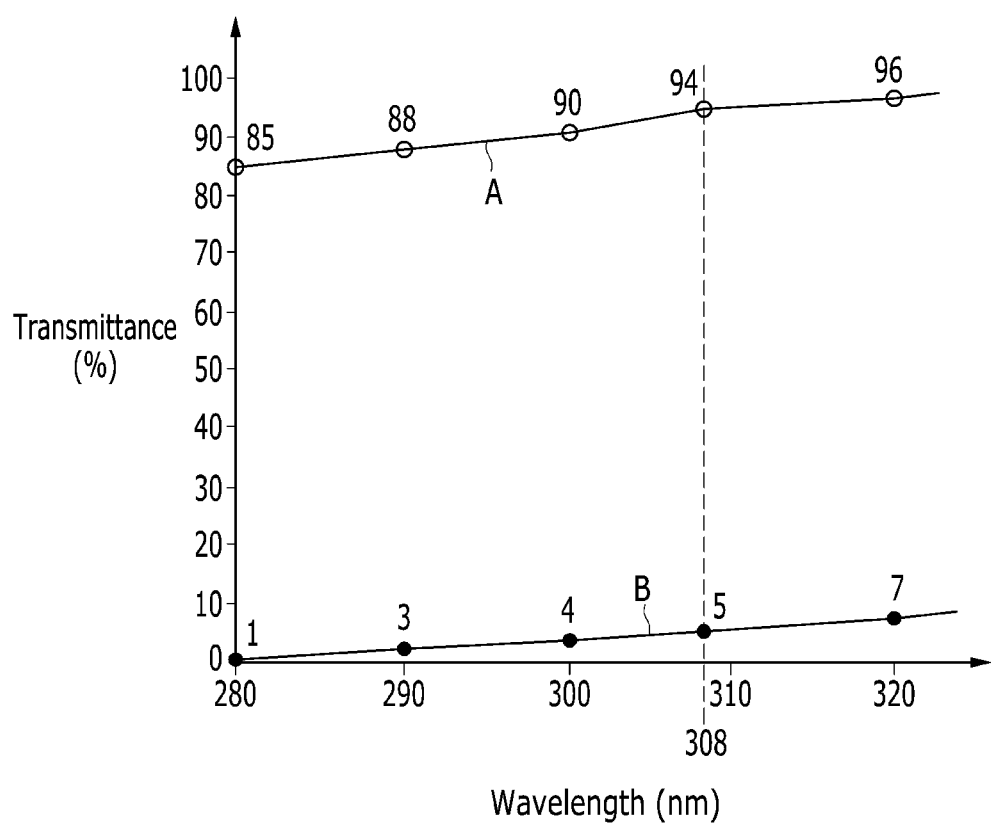
FIG. 5 is a graph illustrating a transmittance curved line A of a first insulating layer of the LCD according to the exemplary embodiment of the invention and a transmittance curved line B of the first insulating layer of the LCD according to the related art.

FIG. 5 is a graph illustrating a transmittance curved line A of a first insulating layer of the LCD according to the exemplary embodiment of the invention and a transmittance curved line B of the first insulating layer of the LCD according to the related art.

As illustrated in FIG. 5, the first insulating layer of the LCD according to the related art is the silicon nitride layer (P-SiNx:H) deposited by mixing three kinds of raw gases ($SiH_4+NH_3+N_2$) and when the first insulating layer is provided at a thickness of about 200 nm, transmittance of the silicon nitride layer for light having a wavelength of about 308 nm is considerably smaller as much as about 5%, for example. However, the first insulating layer 140 of the LCD according to the exemplary embodiment of the invention is the silicon nitride layer (P-SiNx:F) which is provided by providing a reaction of mixed gas of silicon fluoride (SiF$_4$) and nitrogen (N$_2$) in a CVD apparatus and it may be appreciated that when the first insulating layer 140 is provided to have a thickness of about 200 nm, transmittance of the silicon nitride layer for light having a wavelength of about 308 nm is considerably higher as much as about 94%, for example.

Further, even when the thickness of the silicon nitride layer (P-SiNx:F) is about 400 nm, a Xenon-chloride excimer laser beam of which the wavelength is about 308 nm is transmitted about 88% or more, and thus film peeling does not occur even when light of 200 joules per square centimeter (J/cm$^2$) pulse is irradiated, for example.

An active member 150 and a pixel electrode 190 are disposed on the first insulating layer 140. The active member 150 partially overlaps the bottom gate electrode 124 and the pixel electrode 190 extends from the active member 150 and thus is provided to occupy a wide area. The active member 150 includes a channel 154 overlapping the bottom gate electrode 124 and a source electrode 153 and a drain electrode 155 which are positioned at both sides of the channel 154. The drain electrode 155 is positioned between the channel 154 and the pixel electrode 190. The drain electrode 155 is substantially continuously connected to the pixel electrode 190 without a boundary line. As described above, it may improve the aperture ratio since the pixel electrode 190 is connected to the drain electrode 155 on the same layer of the same material as the drain electrode 155 and thus there is no need to define the separate contact hole for connecting the pixel electrode 190 to the drain electrode 155.

In an exemplary embodiment, the active member 150 and the pixel electrode 190 include the oxide semiconductor, in which the oxide semiconductor may include at least one of oxide which is based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-zinc-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are composite oxides thereof.

A second insulating layer 160 which covers the active member 150 and the pixel electrode 190 is disposed on the first insulating layer 140. In an exemplary embodiment, the second insulating layer 160 may be the silicon nitride layer (P-SiNx:F or P-SiONx:F) including a fluorine atom of about 10 atm % to about 35 atm %, for example. In an exemplary embodiment, a thickness of the second insulating layer 160 may be about 50 nm to about 1000 nm, preferably, about 70 nm to about 700 nm, for example.

Data lines 171 and a top gate electrode 125 are disposed on the second insulating layer 160. The data lines 171 transfer data signals and mainly extend in a vertical direction to intersect the gate lines 121. A protruding part 173 which extends from the data line 171 toward the bottom gate electrode 124 is connected to the source electrode 153 through a contact hole 61 which is defined in the second insulating layer 160. In an exemplary embodiment, the data line 171 may include a data pad part (not illustrated) for connecting to another layer or an external driving circuit.

The top gate electrode 125 overlaps the channel 154 and the bottom gate electrode 124. In an exemplary embodiment, the top gate electrode 125 is connected to the bottom gate electrode 124 through second contact holes 62 which are defined in the first insulating layer 140 and the second insulating layer 160. Therefore, a double gate structure applying a gate voltage from both of the bottom and top portions of the channel 154 is adopted and thus electron mobility inside the channel 154 may be improved. In an exemplary embodiment, when the top gate electrode 125 includes an opaque metal material, the channel 154 including the oxide semiconductor may be blocked from external light, thereby improving the reliability of the TFT. Further, it may prevent an off current from occurring since the common electrode 270 overlaps the pixel electrode 190 including the oxide semiconductor, and thus the channel 154 of the active member 150 which is disposed on the same layer as the pixel electrode 190 and includes the oxide semiconductor may be affected by the electric field of the common electrode 270 but the double gate structure configured may block the electric field of the common electrode 270 from being applied to the top gate electrode 125.

In an exemplary embodiment, a width d2 of the top gate electrode 125 may be smaller than a width d1 of the bottom gate electrode 124. Further, an edge of the top gate electrode 125 is positioned inside an edge of the corresponding bottom gate electrode 124. Therefore, the top gate electrode 125 does not protrude outside the edge of the bottom gate electrode 124. Therefore, the whole region of the top gate electrode 125 overlaps the bottom gate electrode 124, but the bottom gate electrode 124 has a region in which the bottom gate electrode 124 does not overlap the top gate electrode 125. Therefore, since a distance d3 between the top gate electrode 125 and the pixel electrode 190 adjacent thereto may be maximized, a parasitic capacity between the top gate electrode 125 and the pixel electrode 190 is minimized to minimize a kickback voltage at the time of turning off the TFT, thereby suppressing afterimage occurrence.

In an exemplary embodiment, when the width d2 of the top gate electrode 125 is smaller than the width d1 of the bottom gate electrode 124, even though a high voltage of about 30 volts (V) to about 40 V, for example, is applied to the source electrode 153 and the pixel electrode 190 through the data line 171, the distance d3 between the top gate electrode 125 and the pixel electrode 190 adjacent thereto is maximized and therefore it is difficult to generate a threshold voltage shift of the TFT.

The bottom gate electrode 124 and the top gate electrode 125 form a single TFT along with the active member 150 which includes the channel 154, the source electrode 153, and the drain electrode 155. Therefore, a data voltage applied from the data line 171 through the first contact hole 61 is transferred to the pixel electrode 190 through the TFT.

In an exemplary embodiment, the data line 171 and the top gate electrode 125 may include refractory metals such as molybdenum, chromium, tantalum, and titanium or an alloy thereof and may have a multilayer structure which includes a refractory metal layer (not illustrated) and a low-resistance conductive layer (not illustrated). An example of the multilayer structure may include a double layer that includes a bottom layer including chromium or molybdenum (alloy) and a top layer including aluminum (alloy) and a triple layer that includes a bottom layer including molybdenum (alloy), an intermediate layer including aluminum (alloy), and a top layer including molybdenum (alloy). However, the data line 171 may include various metals or conductors in addition thereto.

A passivation layer 180 is disposed on the second insulating layer 160, the data line 171, and the top gate electrode 125 to cover the second insulating layer 160, the data line 171, and the top gate electrode 125. The passivation layer 180 is to prevent a short between the pixel electrode 190 and the common electrode 270, and may be thinly provided as much as possible within a range in which the short does not occur. In an exemplary embodiment, the passivation layer 180 may include an organic material or an inorganic material.

The common electrode 270 is disposed on the passivation layer 180. The common electrode 270 is divided into a plurality of common branch electrodes 272 by a common opening 271, in which the plurality of common branch electrodes 272 overlaps the pixel electrodes 190.

An extending direction of the common electrode 270 is disposed to be parallel with an extending direction of the data line 171 and an extending direction of the pixel electrode 190. The common electrode 270 generates an electric field along with the pixel electrode 190 to align a liquid crystal. In an exemplary embodiment, the common electrode 270 may include a transparent conductive layer such as transparent conductive oxide ("TCO") including indium tin oxide ("ITO"), indium zinc oxide ("IZO"), and the like. The exemplary embodiment of the invention describes the common branch electrode which extends in a vertical direction to the extending direction of the gate line 121 and describes other components based on common branch electrode but is not limited thereto, and therefore the common branch electrode which extends in a direction parallel with the extending direction of the gate line 121 may be provided.

An alignment layer 11 is applied on the common electrode 270 and the passivation layer 180 and the alignment layer 11 may be a horizontal alignment layer and is rubbed in a predetermined direction.

Next, the top display panel 200 will be described.

A light blocking member 220 is disposed on the substrate 210 including transparent glass, plastic, or the like. The light blocking member 220 is also referred to as a black matrix and stops a light breakage. Further, a plurality of color filters 230 is disposed on the substrate 210. An overcoat 250 is disposed on the color filter 230 and the light block member 220. In an exemplary embodiment, the overcoat 250 may include an organic material to prevent the color filter 230 from being exposed and provide a flat surface. In another exemplary embodiment, the overcoat 250 may be omitted. The alignment layer may be disposed on the overcoat 250.

The liquid crystal layer 3 positioned between the bottom display panel 100 and the top display panel 200 includes a liquid crystal molecule (not illustrated), in which the liquid crystal molecule may be aligned to make a major axis thereof be horizontal to surfaces of the two display panels 100 and 200 in the state in which no electric field is present.

A light unit (not illustrated) which generates light and provides the generated light to the two display panels 100 and 200 may be further provided outside the substrate 110 of the bottom display panel 100.

The pixel electrode 190 to which the data voltage is applied generates the electric field in the liquid crystal layer 3 along with the common electrode 270 to which the common voltage is applied to determine the direction of the liquid crystal molecule of the liquid crystal layer 3 and display the corresponding image.

The manufacturing method of an LCD according to the exemplary embodiment of the invention will be described below in detail with reference to FIGS. 6 to 12.

Figure 6:
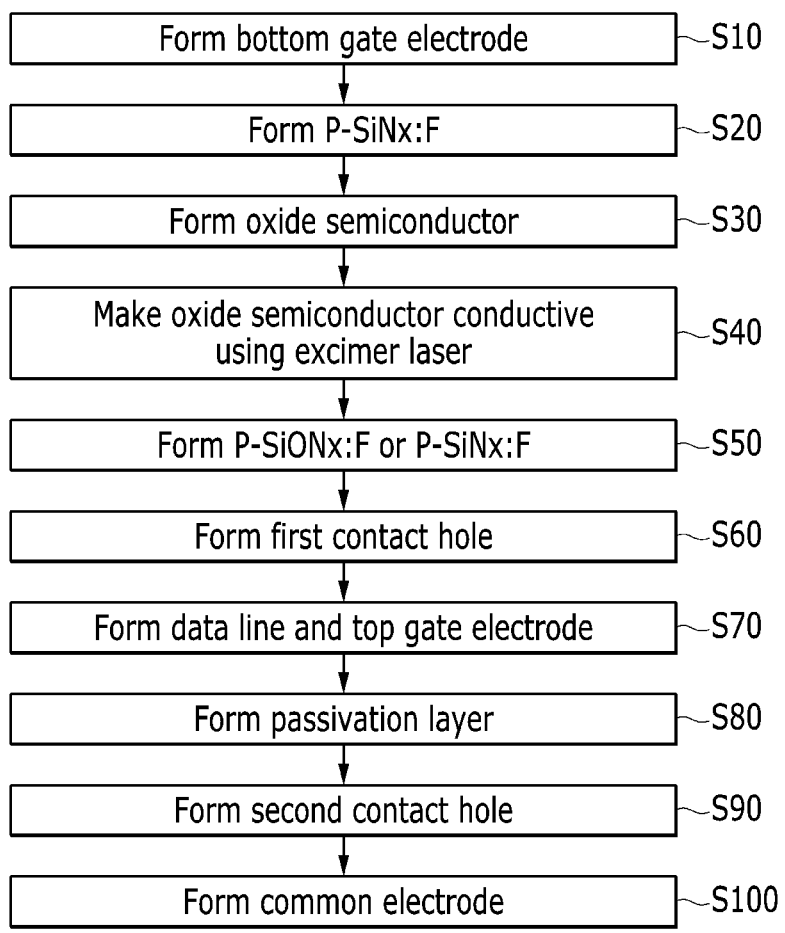
FIG. 6 is a flow chart of a manufacturing method of an LCD according to an exemplary embodiment of the invention.
Figure 7:
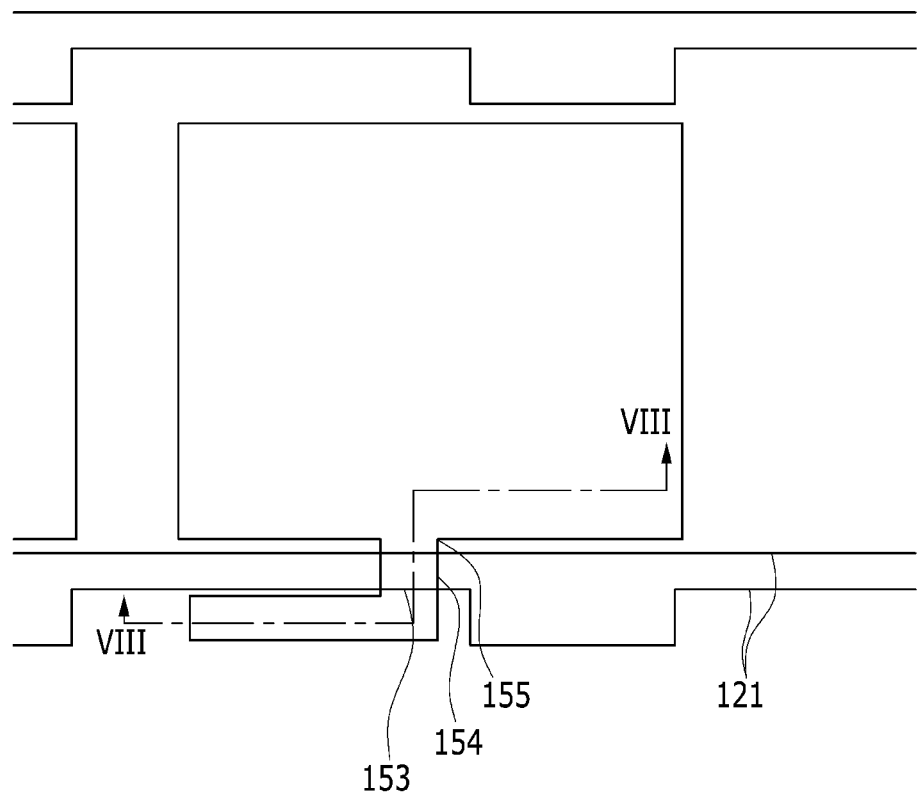
FIGS. 7, 9 and 11 are plan views sequentially illustrating the manufacturing method of an LCD according to the exemplary embodiment of the invention.
Figure 8:
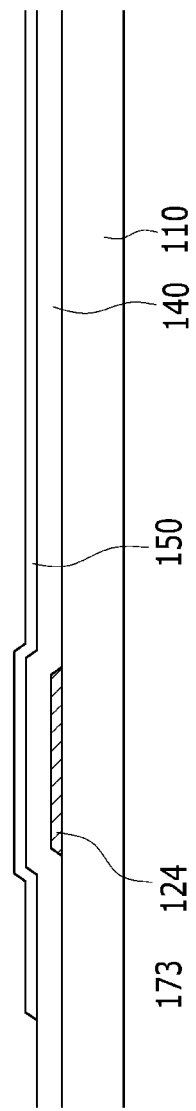
FIG. 8 is a cross-sectional view of the LCD of FIG. 7 taken along line VIII-VIII.
Figure 9:
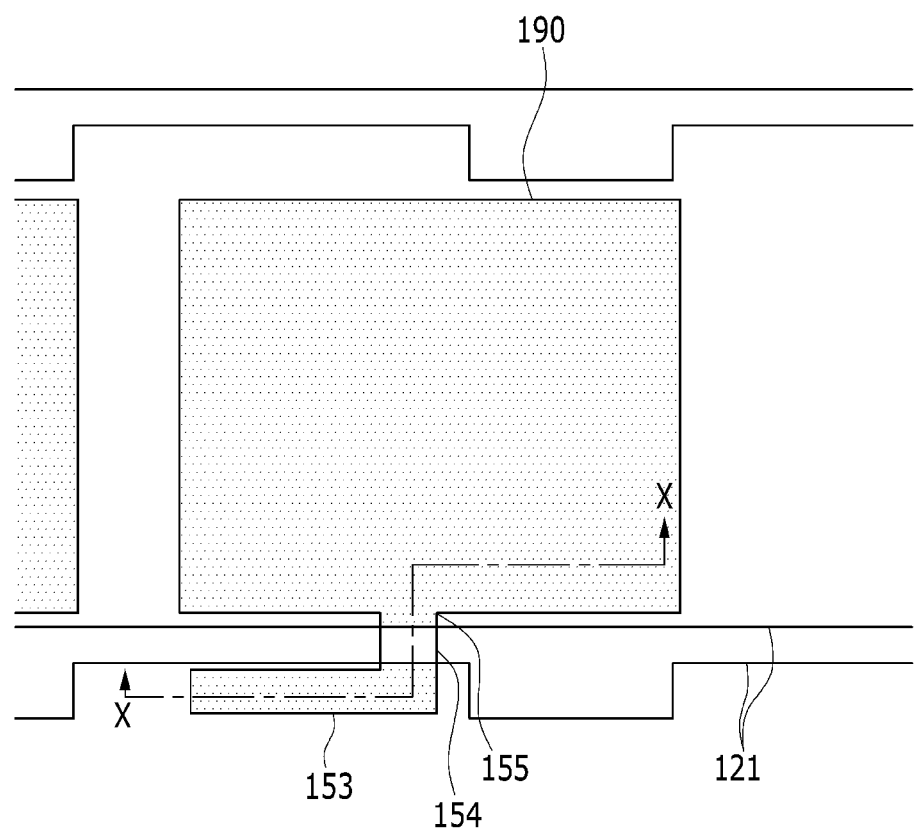
Figure 10:
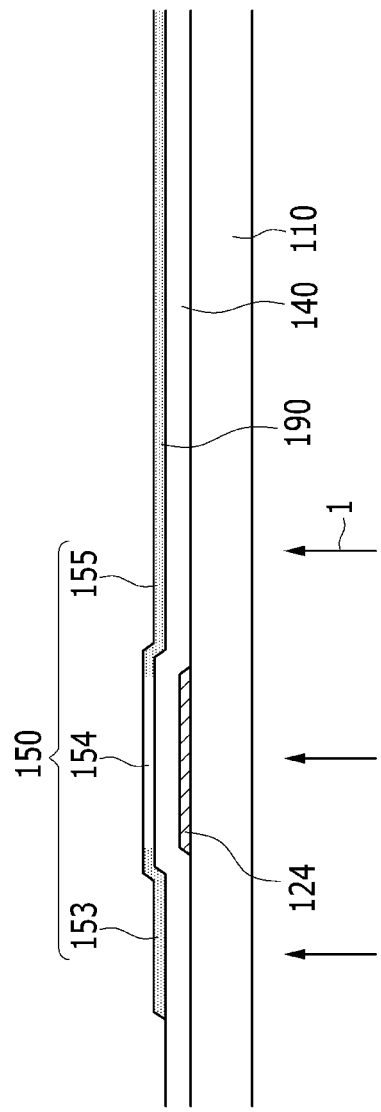
FIG. 10 is a cross-sectional view of the LCD of FIG. 9 taken along line X-X.
Figure 11:
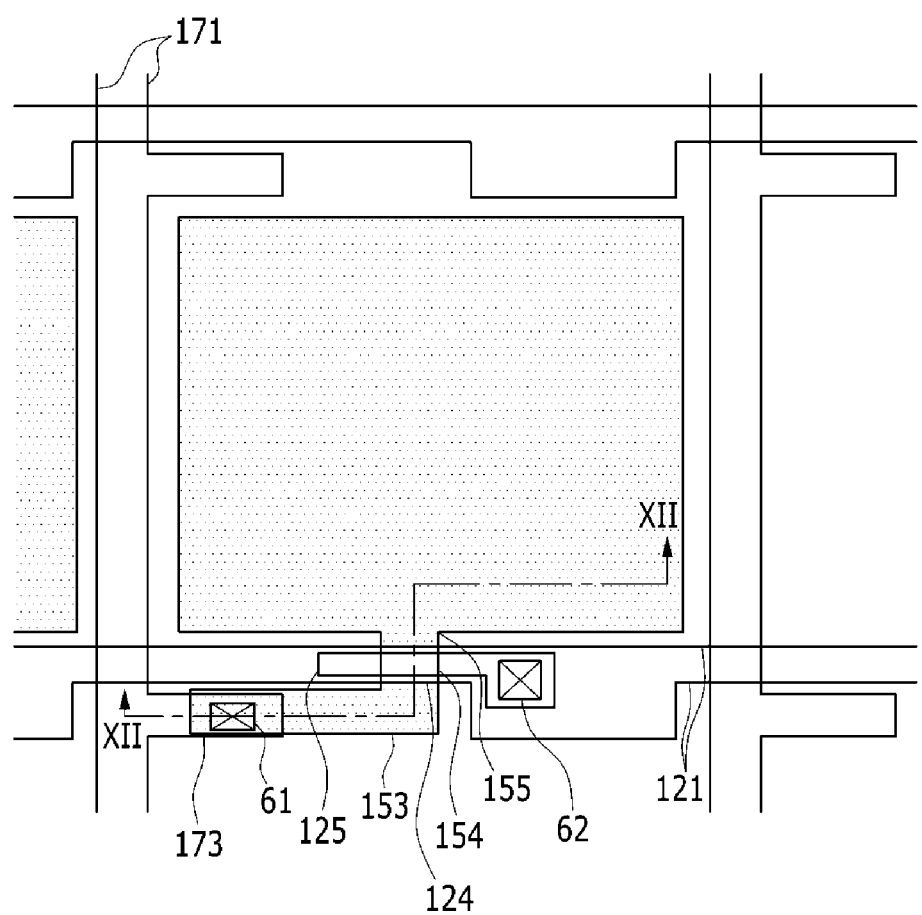
Figure 12:
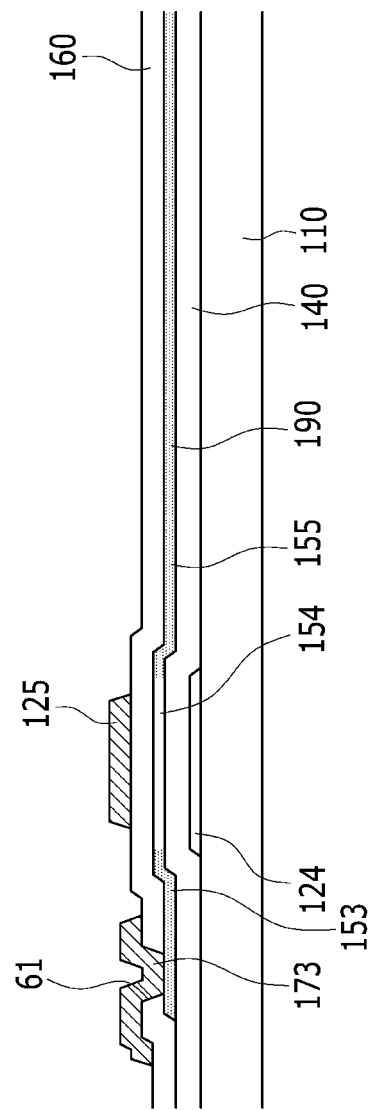
FIG. 12 is a cross-sectional view of the LCD of FIG. 11 taken along line XII-XII.

FIG. 6 is a flow chart of a manufacturing method of an LCD according to an exemplary embodiment of the invention, FIGS. 7, 9 and 11 are plan views sequentially illustrating the manufacturing method of an LCD according to the exemplary embodiment of the invention, FIG. 8 is a cross-sectional view of the LCD of FIG. 7 taken along line VIII-VIII, FIG. 10 is a cross-sectional view of the LCD of FIG. 9 taken along line X-X, and FIG. 12 is a cross-sectional view of the LCD of FIG. 11 taken along line XII-XII.

First, as illustrated in FIGS. 6 to 8, the gate line 121 including the bottom gate electrode 124 is disposed on the substrate 110 (S10). Further, the first insulating layer 140 is disposed thereon as the silicon nitride layer (P-SiNx:F) which is provided by providing a reaction of mixed gas of silicon fluorine ($SiF_4$) and nitrogen ($N_2$) in a CVD apparatus (S20).

Further, the oxide semiconductor is disposed on the first insulating layer 140 (S30).

Next, as illustrated in FIGS. 6, 9, and 10, the excimer laser 1 is irradiated from a bottom portion of the substrate 110 using the bottom gate electrode 124 as a light blocking mask to form the active member 150 and the pixel electrode 190 on the oxide semiconductor (S40). The active member 150 overlaps the bottom gate electrode 124 to form the channel 154 in the region in which the excimer laser 1 is not irradiated and the excimer laser 1 is irradiated to regions of both sides of the channel 154 to make the regions conductive, thereby forming the source electrode 153 and the drain electrode 155. Most of the regions connected to the drain electrode 155 in the oxide semiconductor are provided with the pixel electrode 190.

Next, as illustrated in FIGS. 6, 11, and 12, the second insulating layer 160 which covers the first insulating layer 140, the active member 150, and the pixel electrode 190 is provided (S50). In an exemplary embodiment, the second insulating layer 160 is provided as the silicon nitride layer (P-SiNx:F or P-SiONx:F) which is provided by providing the reaction of mixed gas of silicon fluoride ($SiF_4$) and nitrogen ($N_2$) in the CVD apparatus, for example. Further, a first contact hole 61 which exposes the source electrode 153 is defined in the second insulating layer 160 (S60). Further, the data lines 171 and the top gate electrode 125 are disposed on the second insulating layer 160 (S70).

Next, as illustrated in FIG. 6 and FIGS. 1 to 4, the passivation layer 180 which covers the data lines 171 and the top gate electrode 125 is provided (S80). In an exemplary embodiment, the passivation layer 180 is provided as the silicon nitride layer (P-SiNx:F) which is provided by providing the reaction of mixed gas of silicon fluorine ($SiF_4$) and nitrogen ($N_2$) in the CVD apparatus, for example. Further, the second contact hole 62 is defined in the passivation layer 180 (S90).

Further, the common electrode 270 which overlaps the pixel electrode 190 is disposed on the passivation layer 180 (S100). Further, the alignment layer 11 is disposed on the bottom display panel 100 and then the liquid crystal layer 3 is injected between the top display panel 200 and the bottom display panel 100 to complete the liquid crystal display.

According to the exemplary embodiment of the invention, the common electrode 270, the data line 171, and the pixel electrode 190 are not bent within a pixel area in which the gate line and the data line intersect each other, while being insulated from each other, but other exemplary embodiments in which the data line, the pixel electrode, and the common electrode are bent may be possible.

Hereinafter, another exemplary embodiment of the invention will be described with reference to FIGS. 13 to 15.

Figure 13:
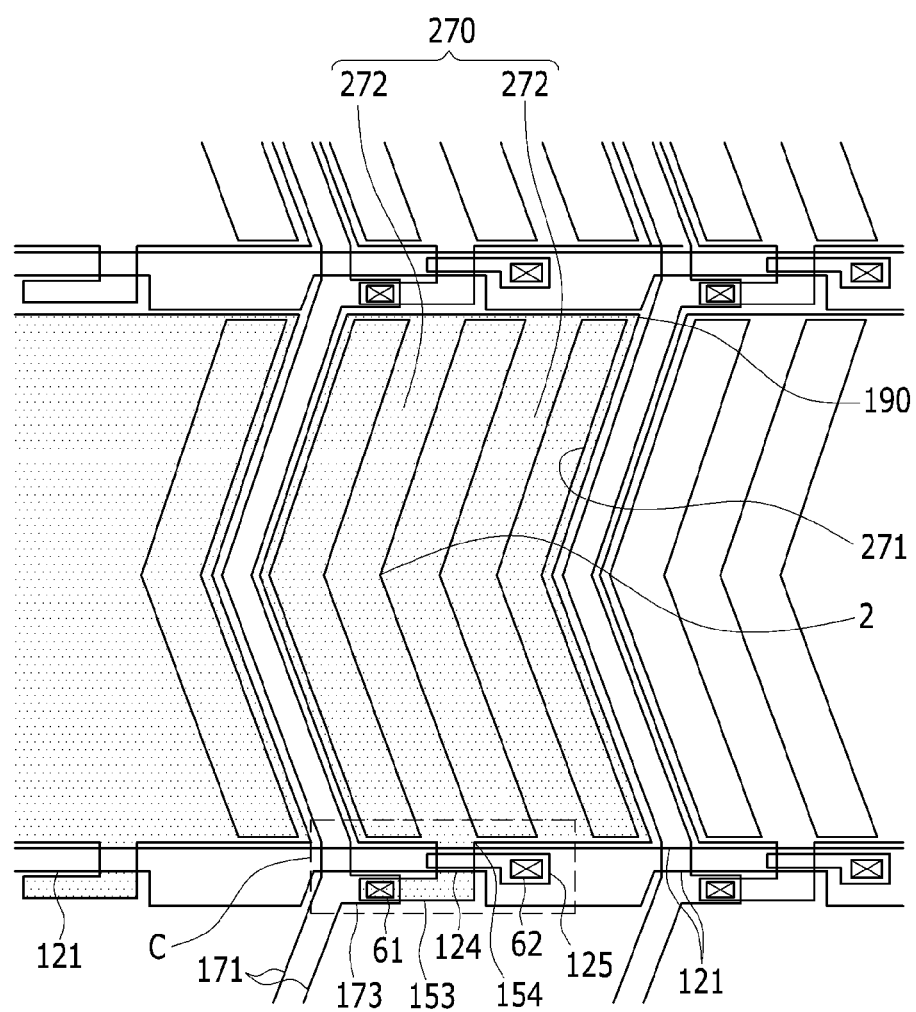
FIG. 13 is a plan view of an LCD according to another exemplary embodiment of the invention.
Figure 14:
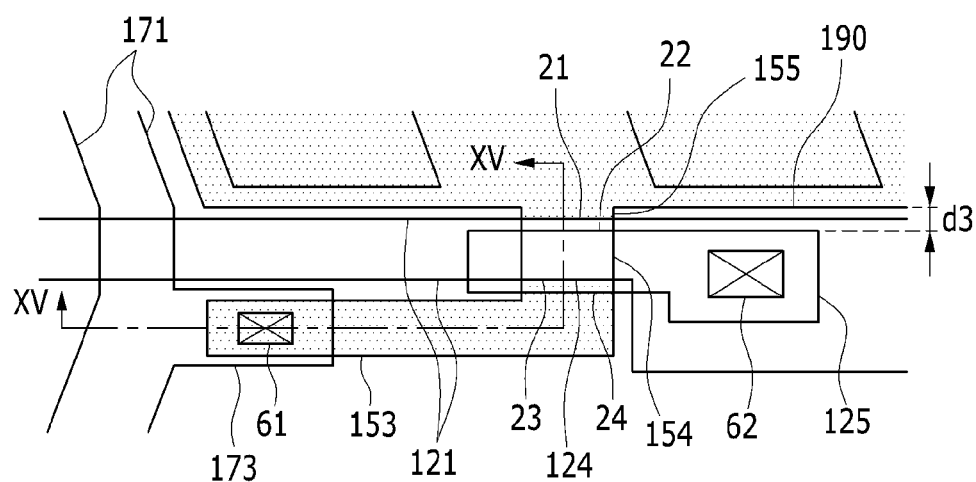
FIG. 14 is an enlarged view of portion C of FIG. 13.
Figure 15:
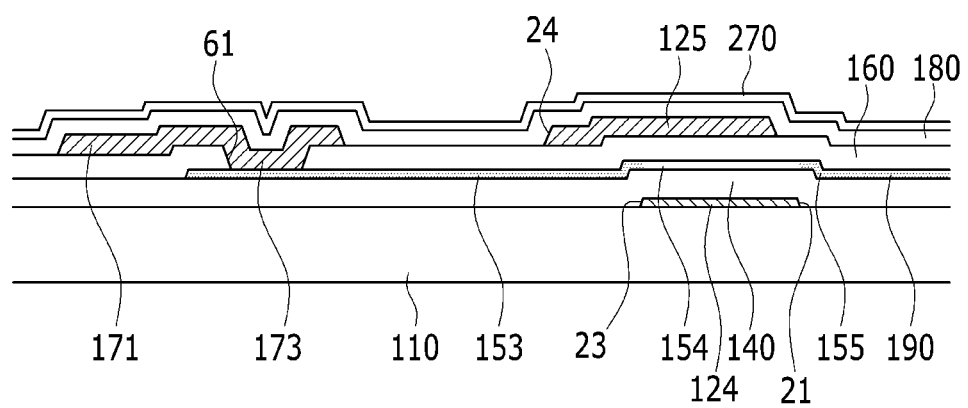
FIG. 15 is a cross-sectional view of the LCD of FIG. 13 taken along line XV-XV of FIG. 14.

FIG. 13 is a plan view of an LCD according to another exemplary embodiment of the invention, FIG. 14 is an enlarged view of portion C of FIG. 13, and FIG. 15 is a cross-sectional view of the LCD of FIG. 13 taken along line XV-XV of FIG. 14.

In comparison to the exemplary embodiment of the invention illustrated in FIGS. 1 to 4, another exemplary embodiment of the invention illustrated in FIGS. 13 to 15 is substantially the same as the exemplary embodiment of the invention illustrated in FIGS. 1 to 4 except that the common electrode, the data line, and the pixel electrode are bent and the edge of the top gate electrode is positioned outside the corresponding edge of the bottom gate electrode, and therefore the repeated description thereof will be omitted.

As illustrated in FIGS. 13 to 15, in an LCD according to another exemplary embodiment of the invention, the data line 171, the pixel electrode 190, and the common branch electrode 272 of the common electrode 270 have a bending part 2 having a bent shape to improve transmittance. In an exemplary embodiment, the bending part may have a V-letter shape in an intermediate region of a pixel area. However, the shape of the data line 171, the pixel electrode 191, and the common electrode 270 is not limited to the foregoing shape, and therefore the data line 171, the pixel electrode 191, and the common electrode 270 may have any shape.

Further, as illustrated in FIG. 14, a first edge 21 nearest to the pixel electrode 190 among the edges of the bottom gate electrode 124 is disposed to be more adjacent to the pixel electrode 190 than a second edge 22 nearest to the pixel electrode 190 among the edges of the top gate electrode 125. Therefore, the distance d3 between the top gate electrode 125 and the pixel electrode 190 is increased to minimize the parasitic capacitance generated between the top gate electrode 125 and the pixel electrode 190, thereby minimizing the kickback voltage and thus minimize the afterimage occurrence.

In this case, a third edge 23 which is at an opposite side to the first edge 21 among the edges of the bottom gate electrode 124 is positioned outside a fourth edge 24 which is at an opposite side to the second edge 22 among the edges of the top gate electrode 125.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display, comprising:
   a substrate;
   a gate line disposed on the substrate and including a bottom gate electrode;
   a first insulating layer covering the gate line;
   an active member including a channel which is defined on the first insulating layer and overlaps the bottom gate electrode and a source electrode and a drain electrode which are positioned at both end sides of the channel;
   a pixel electrode disposed on the same layer as the active member;
   a second insulating layer covering the active member and the pixel electrode;
   a data line disposed on the second insulating layer and connected to the active member;
   a passivation layer covering the data line; and
   a common electrode disposed on the passivation layer and overlapping the pixel electrode,
   wherein the active member and the pixel electrode include an oxide semiconductor, the pixel electrode is not overlapped with the source electrode, and both an entire bottom surface of the pixel electrode and an entire bottom surface of the source electrode are contacted with the first insulating layer.

2. The liquid crystal display of claim 1, wherein:
   the first insulating layer is a silicon nitride layer which includes a fluorine atom in the range of about 10 atm % to about 35 atm %.

3. The liquid crystal display of claim 1, further comprising:
   a top gate electrode disposed on the second insulating layer and overlapping the bottom gate electrode.

4. The liquid crystal display of claim 3, wherein:
   a width of the top gate electrode is smaller than that of the bottom gate electrode.

5. The liquid crystal display of claim 4, wherein:
   an edge of the top gate electrode is positioned inside an edge of the corresponding bottom gate electrode.

6. The liquid crystal display of claim 3, wherein:
   a first edge nearest to the pixel electrode among edges of the bottom gate electrode is more adjacent to the pixel electrode than a second edge nearest to the pixel electrode among edges of the top gate electrode.

7. The liquid crystal display of claim 3, wherein:
   the data line is connected to the active member through a first contact hole which is defined in the first insulating layer and the top gate electrode is connected to the bottom gate electrode through second contact holes which are defined both in the first insulating layer and the second insulating layer.

8. The liquid crystal display of claim 1, wherein:
   the second insulating layer is a silicon nitride layer which includes a fluorine atom in a range of about 10 atm % to about 35 atm %.

9. The liquid crystal display of claim 8, wherein:
   a thickness of the first insulating layer is about 50 nanometers to about 1000 nanometers and a thickness of the second insulating layer is about 50 nanometers to about 1000 nanometers.

10. The liquid crystal display of claim 1, wherein:
    an extending direction of the data line, an extending direction of the pixel electrode, and an extending direction of the common electrode are parallel with one another.

11. The liquid crystal display of claim 10, wherein:
    the data line, the pixel electrode, and the common electrode are bent within a pixel area in which the gate line and the data line intersect each other, while being insulated from each other.

12. The liquid crystal display of claim 11, wherein:
    an angle between the bottom gate electrode and the data line is 70 degrees to 80 degrees.

13. A manufacturing method of a liquid crystal display, comprising:
    forming a gate line including a bottom gate electrode on a substrate;
    forming a first insulating layer as a silicon nitride layer covering the gate line and including a fluorine atom of about 10 atm % to about 35 atm %;
    forming an oxide semiconductor on the first insulating layer;

forming an active member and a pixel electrode on the oxide semiconductor by irradiating an excimer laser using the bottom gate electrode as a light blocking mask;

forming a second insulating layer covering the active member and the pixel electrode;

forming a data line intersecting the gate line on the second insulating layer;

forming a passivation layer covering the data line; and forming a common electrode overlapping the pixel electrode on the passivation layer.

14. The manufacturing method of claim 13, wherein:

in the forming the data line, the top gate electrode overlapping the bottom gate electrode is provided.

15. The manufacturing method of claim 13, wherein:

the second insulating layer is provided as a silicon nitride layer which includes a fluorine atom of about 10 atm % to about 35 atm %.

16. The manufacturing method of claim 15, wherein:

the first insulating layer and the second insulating layer are provided by providing a reaction of mixed gas of silicon fluorine ($SiF_4$) and nitrogen ($N_2$) in a chemical vapor deposition apparatus.

17. The liquid crystal display of claim 1, wherein:

the drain electrode is substantially continuously connected to the pixel electrode without a boundary line therebetween.

18. The liquid crystal display of claim 17, wherein:

the pixel electrode is connected to the drain electrode with bottom surface defining the entire pixel electrode and the drain electrode disposed directly on the same layer of the same material.

* * * * *